(12) United States Patent
Lakus-Becker

(10) Patent No.: US 7,436,332 B2
(45) Date of Patent: Oct. 14, 2008

(54) RUNLENGTH ENCODING OF LEADING ONES AND ZEROS

(75) Inventor: Axel Lakus-Becker, Artarmon (AU)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/847,947

(22) Filed: Aug. 30, 2007

(65) Prior Publication Data

US 2008/0062020 A1 Mar. 13, 2008

(30) Foreign Application Priority Data

Aug. 31, 2006 (AU) .............................. 2006204634

(51) Int. Cl.
*H03M 7/00* (2006.01)
(52) U.S. Cl. .............................. 341/59; 341/58; 341/61; 341/65; 341/67
(58) Field of Classification Search .................. 341/58, 341/59, 61, 65, 67, 69
See application file for complete search history.

(56) References Cited

U.S. PATENT DOCUMENTS

| | | | |
|---|---|---|---|
| 5,271,016 A * | 12/1993 | Hilden et al. ............... | 714/752 |
| 5,648,776 A * | 7/1997 | Widmer ....................... | 341/100 |
| 6,213,879 B1 * | 4/2001 | Niizuma et al. .............. | 463/36 |
| 6,392,572 B1 * | 5/2002 | Shiu et al. .................... | 341/81 |
| 6,437,714 B1 * | 8/2002 | Kim et al. ..................... | 341/81 |
| 6,456,208 B1 * | 9/2002 | Nazari et al. .................. | 341/59 |
| 6,476,737 B1 * | 11/2002 | Caroselli et al. .............. | 341/59 |
| 6,545,615 B2 * | 4/2003 | Kahlman et al. .............. | 341/59 |
| 6,628,945 B1 | 9/2003 | Koorapaty et al. ........... | 455/434 |
| 6,795,947 B1 | 9/2004 | Siegel et al. ................. | 714/802 |
| 6,876,315 B1 * | 4/2005 | Widmer ....................... | 341/58 |
| 6,970,114 B2 * | 11/2005 | Lovell ......................... | 341/100 |
| 7,119,721 B2 * | 10/2006 | Coene .......................... | 341/59 |
| 2004/0240590 A1 | 12/2004 | Cameron et al. ............ | 375/340 |

* cited by examiner

*Primary Examiner*—Linh V Nguyen
(74) *Attorney, Agent, or Firm*—Fitzpatrick, Cella, Harper & Scinto

(57) ABSTRACT

A method and an encoder (1001) are disclosed for encoding an input bitstream derived from a block of coefficients relating to video data. Leading zeros and tailing zeros are determined and removed (4050, 4070) from the input bitstream. Parity bits are generated (60) for bits remaining in the input bitstream. An encoded bitstream (1032) is then generated, where the encoded bitstream (1032) comprises the number of leading zeros, the number of tailing zeros, and the parity bits.

9 Claims, 7 Drawing Sheets

RUNLENGTH ENCODING OF LEADING ONES AND ZEROS

CROSS-REFERENCE TO RELATED PATENT APPLICATIONS

This application claims the right of priority under 35 U.S.C. § 119 based on Australian Patent Application No. 2006204634, filed Aug. 31, 2006, which is incorporated by reference herein in its entirety as if fully set forth herein.

FIELD OF THE INVENTION

The present invention relates generally to video encoding and decoding and, in particular, to a bypass to a parallel concatenated code.

BACKGROUND

Various products, such as digital cameras and digital video cameras, are used to capture images and video. These products contain an image sensing device, such as a charge coupled device (CCD), which is used to capture light energy focussed on the image sensing device that is indicative of a scene. The captured light energy is then processed to form a digital image. There are various formats to represent the digital images or videos, which include Motion JPEG, MPEG2, MPEG4 and H.264. These are all video formats, rather than image or video formats.

All the formats listed above have in common that they are compression formats. While those formats offer high quality and improve the number of images that can be stored on a given media, they typically suffer because of their long encoding runtime.

A complex encoder requires complex hardware. Complex encoding hardware in turn is disadvantageous in terms of design cost, manufacturing cost and physical size of the encoding hardware. Furthermore, long encoding runtime delays the camera shutter. Additionally, more complex encoding hardware has higher battery consumption. As battery life is essential for a mobile device, it is desirable that battery consumption be minimized in mobile devices.

SUMMARY

It is an object of the present invention to substantially overcome, or at least ameliorate, one or more disadvantages of existing arrangements.

According to an aspect of the present invention, there is provided a method of encoding an input bitstream derived from a block of coefficients relating to video data, the method comprising the steps of:

determining and removing from said input bitstream a plurality of leading zeros or tailing zeros;

generating parity bits for bits remaining in said input bitstream; and creating an encoded bitstream comprising a number of leading zeros or tailing zeros and said parity bits.

According to another aspect of the present invention, there is provided an apparatus for implementing any one of the aforementioned method.

According to another aspect of the present invention there is provided a computer program product including a computer readable medium having recorded thereon a computer program for implementing any one of the methods described above.

Other aspects of the invention are also disclosed.

BRIEF DESCRIPTION OF THE DRAWINGS

One or more embodiments of the present invention will now be described with reference to the drawings, in which.

DETAILED DESCRIPTION

Figure 1A:
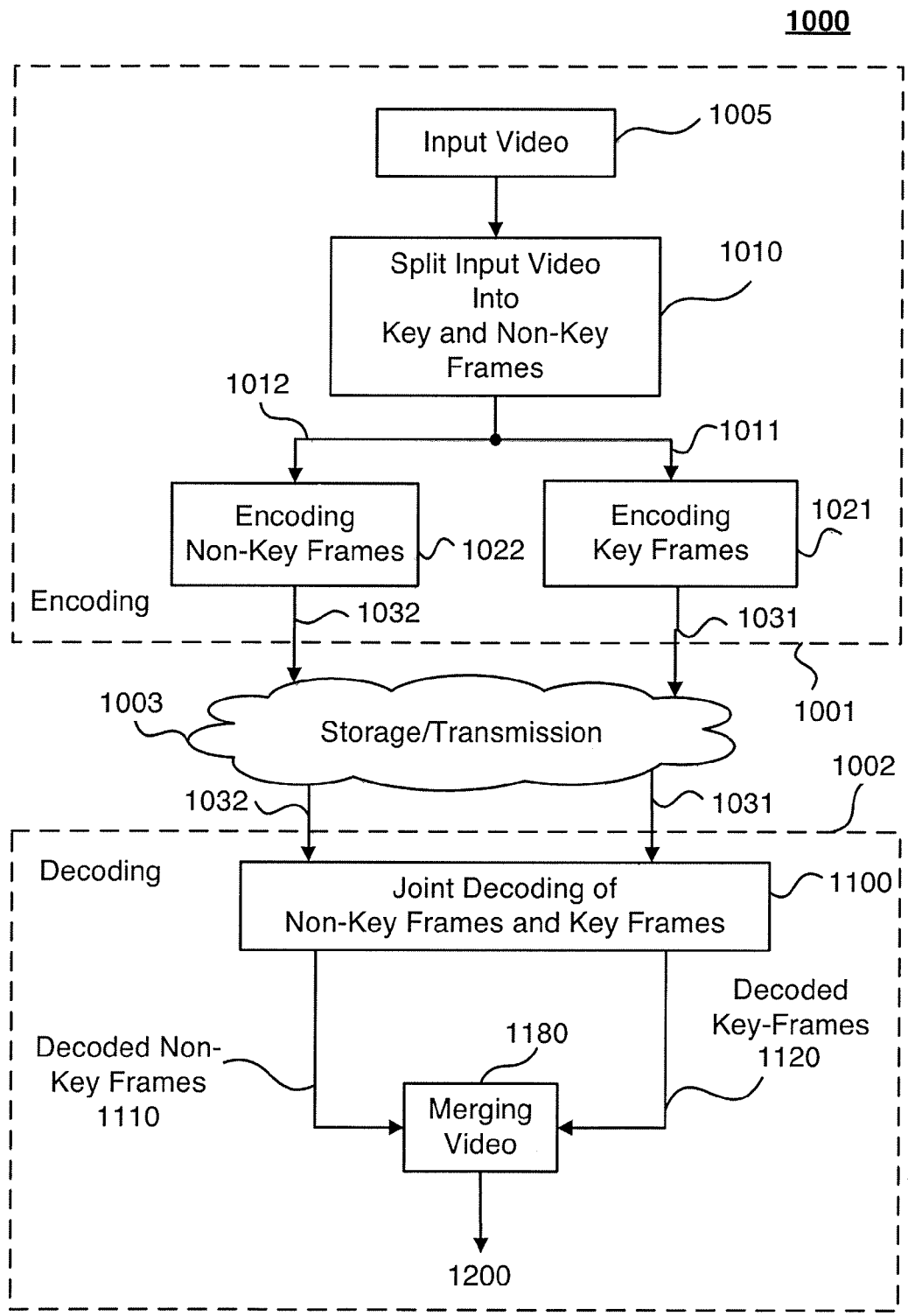
FIG. 1A shows a schematic block diagram of a system 1000 for encoding an input video, for storing or transmitting the encoded video, and for decoding the encoded video.

Where reference is made in any one or more of the accompanying drawings to steps and/or features, which have the same reference numerals, those steps and/or features have for the purposes of this description the same function(s) or operation(s), unless the contrary intention appears.

FIG. 1A shows a system 1000 for encoding an input video 1005, for storing or transmitting the encoded video, and for decoding the encoded video. The system 1000 includes an encoder 1001 and a decoder 1002 connected through a storage or transmission medium 1003.

Figure 5:
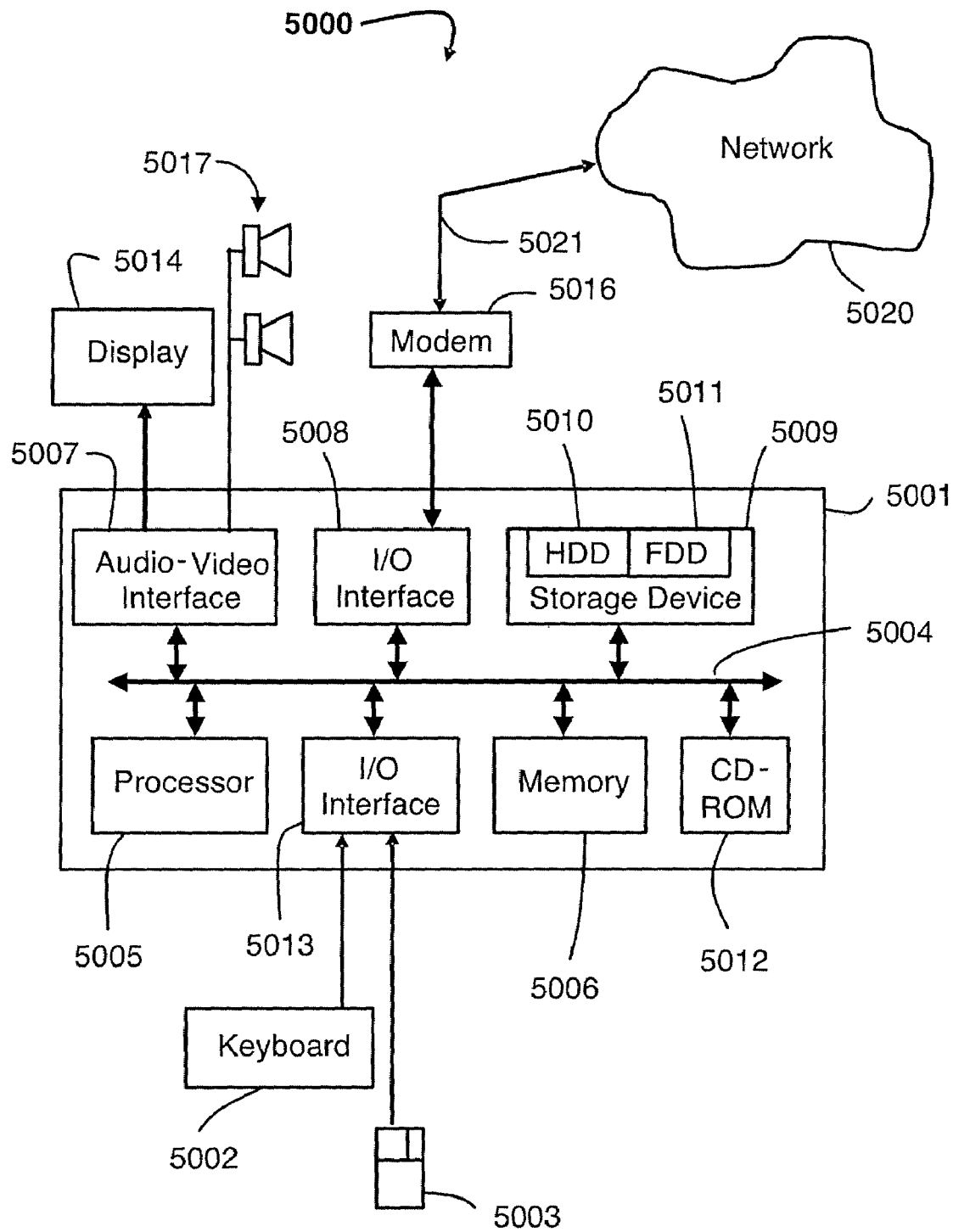
FIG. 5 shows a schematic block diagram of a computer system in which the system shown in FIG. 1A may be implemented.

The components 1001, 1002 and 1003 of the system 1000 may be implemented using a computer system 5000, such as that shown in FIG. 5, wherein the encoder 1001 and decoder 1002 may be implemented as software, such as one or more application programs executable within the computer system 5000. The software may be stored in a computer readable medium, including the storage devices described below, for example. The software is loaded into the computer system 5000 from the computer readable medium, and then executed by the computer system 5000. A computer readable medium having such software or computer program recorded on it is a computer program product.

As seen in FIG. 5, the computer system 5000 is formed by a computer module 5001, input devices such as a keyboard 5002 and a mouse pointer device 5003, and output devices including a display device 5014 and loudspeakers 5017. An external Modulator-Demodulator (Modem) transceiver device 5016 may be used by the computer module 5001 for communicating to and from a communications network 5020 via a connection 5021.

The computer module 5001 typically includes at least one processor unit 5005, and a memory unit 5006. The module 5001 also includes an number of input/output (I/O) interfaces including an audio-video interface 5007 that couples to the video display 5014 and loudspeakers 5017, an I/O interface 5013 for the keyboard 5002 and mouse 5003, and an interface 5008 for the external modem 5016. In some implementations, the modem 5016 may be incorporated within the computer module 5001, for example within the interface 5008. A storage device 5009 is provided and typically includes a hard disk drive 5010 and a floppy disk drive 5011. A CD-ROM drive 5012 is typically provided as a non-volatile source of data.

The components 5005, to 5013 of the computer module 5001 typically communicate via an interconnected bus 5004 and in a manner which results in a conventional mode of operation of the computer system 5000 known to those in the relevant art.

Typically, the application programs discussed above are resident on the hard disk drive 5010 and read and controlled in execution by the processor 5005. Intermediate storage of such programs and any data fetched from the network 5020 may be accomplished using the semiconductor memory 5006, possibly in concert with the hard disk drive 5010. In some instances, the application programs may be supplied to the user encoded on one or more CD-ROM and read via the corresponding drive 5012, or alternatively may be read by the user from the network 5020. Still further, the software can also be loaded into the computer system 5000 from other computer readable media. Computer readable media refers to any storage medium that participates in providing instructions and/or data to the computer system 5000 for execution and/or processing.

The system 1000 may alternatively be implemented in dedicated hardware such as one or more integrated circuits. Such dedicated hardware may include graphic processors, digital signal processors, or one or more microprocessors and associated memories.

In one implementation encoder 1001 and a decoder 1002 are implemented within a camera (not illustrated), wherein the encoder 1001 and the decoder 1002 may be implemented as software executing in a processor of the camera, or implemented using hardware. In another alternative implementation only the encoder is implemented in the camera.

Referring again to FIG. 1A, as in conventional video compression techniques, which include the MPEG1, MPEG2 and MPEG4 compression standards, an input video 1005 is split by a frame splitter 1010 into key frames 1011 and non-key frames 1012. Typically, every $5^{th}$ frame is a key frame. The key frames 1011 and the non-key frames 1012 are encoded in encoders 1021 and 1022 respectively, with encoders 1021 and 1022 operating differently. Also, the encoding of the key frames 1011 and the encoding of the non-key frames 1012 are independent.

Encoded key-frames 1031 and encoded non-key frames 1032 are stored or transmitted using the storage or transmission medium 1003. The decoder 1002 receives both the encoded key-frames 1031 and the encoded non-key frames 1032. A joint decoder 1100 decodes the encoded key-frames 1031 without using information from the non-key frames, while the encoded non-key frames 1032 are decoded using information from the key-frames. The decoded key-frames 1120 and decoded non-key frames 1110 are merged together in a merger 1180 to form output video 1200.

The encoding of frames 1011 and 1012 is now described in greater detail. The encoding of the key frames 1011 is first described, followed by a description of encoding of the non-key frames 1012.

The encoding of key frames 1011 performed in the key frame encoder 1021 preferably employs the JPEG compression standard. In baseline mode JPEG compression, and in reverse using inverse operation decompression, an image (or frame) is typically tiled into a plurality of blocks, each block comprising eight rows of eight pixels (hereinafter referred to as an 8×8 block of pixels or simply a block of pixels). If necessary, extra columns of image pixel data are appended to the image by replicating a column of the image, so that the image width is a multiple of eight. Similarly, a row of the image is replicated to extend the image, if necessary. Each 8×8 block of pixels is then discrete cosine transformed (DCT) into an 8×8 block of DCT coefficients. The coefficients of each block of the image is quantised and arranged in a "zigzag" scan order. The coefficients are then lossless encoded using a zero run-length and magnitude type code with Huffman coding, or Arithmetic coding. In this manner, all the coefficients (i.e. entire zigzag sequence) of one block of pixels are encoded, into a bit-stream, before a next block is encoded into the bit-stream. The blocks of the tiled image are processed in raster scan order as required by the baseline JPEG standard.

In the spectral selection mode of JPEG compression the zigzag sequence of coefficients, for each 8×8 block of DCT coefficients, is divided into a plurality of contiguous segments. Each contiguous segment is then encoded, in order, in separate scans through the image. That is, coefficients in a first segment of each block are encoded into a bit-stream before coefficients of a next segment of each block are encoded, and so on until substantially all segments of preferably every block of the image are encoded.

While JPEG compression is predominantly used to compress a still image, there are various video encoding formats known loosely as "Motion JPEG". Motion JPEG encodes each frame of a video as a still image using JPEG, and provides a compressed video stream format for wrapping all the encoded frames of a video into a Motion JPEG encoded stream. However, Motion JPEG was never formally standardized.

In an alternative implementation the key frame encoder 1021 uses the JPEG2000 standard to encode the key frames 1011. In the JPEG2000 standard encoding an input image is optionally level shifted and transformed with a component transform. Thus, an input RGB colour space image, for example, may be transformed to a YCbCr colour space image. Each component of the (subsequent) image is transformed independently with a discrete wavelet transform. The wavelet transform coefficients are quantized to integer values and tiled into code-blocks. Each code-block is encoded in bit-planes, or fractions thereof, down to some minimum fractional bit-plane with an arithmetic coder. The encoded code-blocks are then grouped along with header information into a JPEG2000 code-stream. A JPEG2000 image is decoded by performing the inverse of each of these steps, as far as is possible.

While JPEG2000 is predominantly used to compress a still image, Motion JPEG2000 encodes each frame of a video as a still image using JPEG2000. It provides a compressed video stream format for wrapping all the encoded frames of a video into a Motion JPEG2000 encoded stream.

In yet another alternative implementation the key frame encoder 1021 uses the H.264 standard to encode the key frames 1011. The H.264 standard is mainly used to compress videos. Intra H.264 is the mode where the H.264 standard is employed to encode key frames of video. Accordingly, the encoder 1021 employs intra H.264 to encode the key frames 1011. In the H.264 standard each frame is divided into one or multiple slices. Each slice consists of macro-blocks which are blocks of 16×16 luminance samples. On each slice a prediction processing step is carried out, which may either be a spatial or a temporal prediction.

The key frame encoder 1021 uses spatial prediction. In spatial prediction, macro-blocks may be subdivided into sub-macro-blocks, with each sub-macro-block having a size of 16×16, 8×8 or 4×4 samples. In spatial prediction all pixels of a block are predicted from block edge pixels.

In temporal prediction, motion estimation is carried out. To achieve more precise motion estimation the macro-blocks are also partitioned into sub-macro-blocks having a size of 16×16, 16×8, 8×16, 8×8, 8×4, 4×8 or 4×4 samples. The different sizes and shapes enhance the precision of the motion prediction.

After the prediction processing step a 2-D transformation is carried out on each block to spatially decorrelate the data. This 2-D transformation supports 8×8 and 4×4 blocks, and is based in integers which enables an exact inverse transformation without rounding errors. After each block has been 2-D transformed, the block samples are quantized. The quantization is controlled by a single quantization parameter which can be different for each single block. After quantization the 2-dimensional blocks are scanned in zigzag fashion such that the highest variance coefficients come first and the lowest variance coefficients come last. Finally, the sequences of coefficients are entropy encoded. In the H.264 standard there are two modes of entropy encoding: variable length coding and binary arithmetic coding. Both of those modes are context adaptive.

Figure 1B:
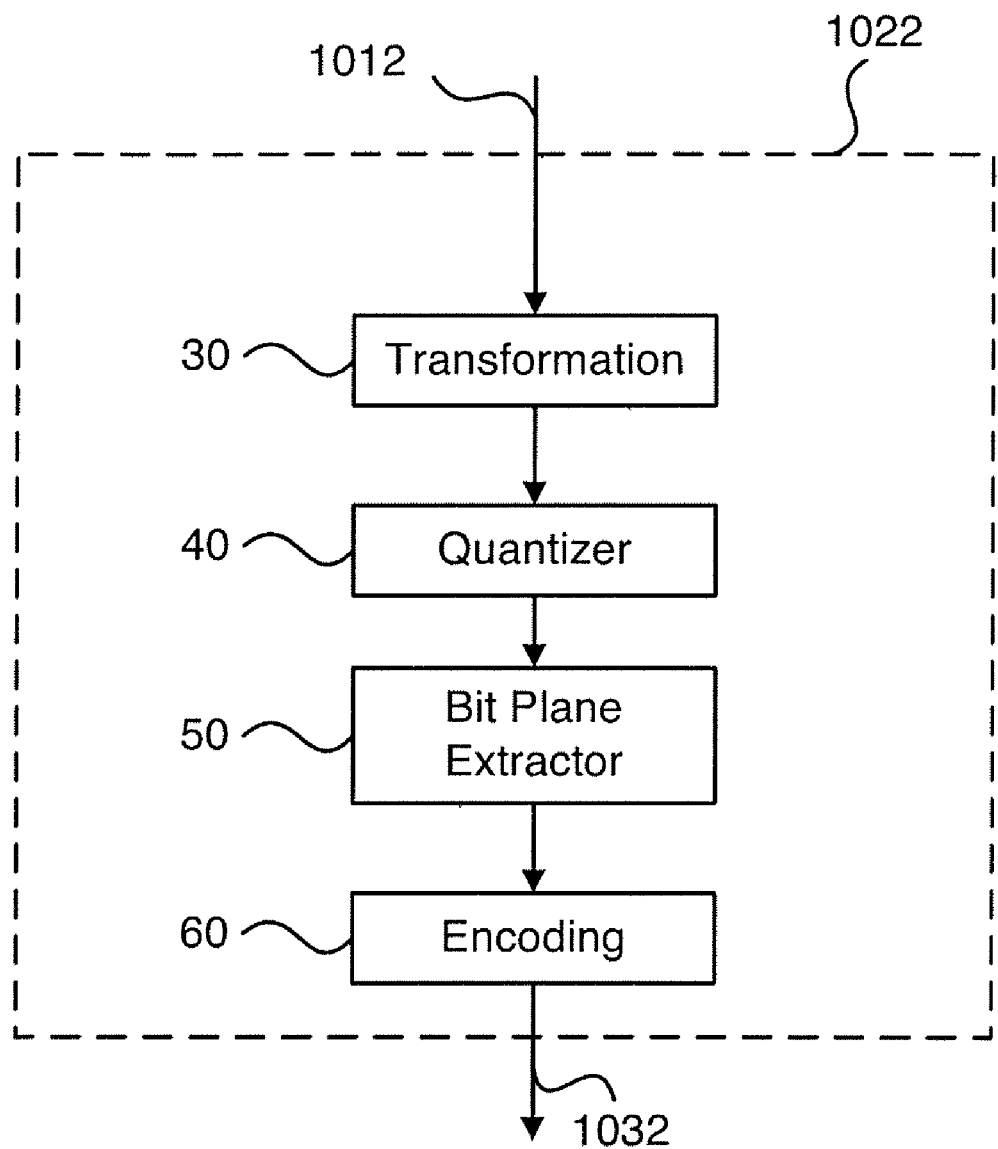
FIG. 1B shows a schematic flow diagram of the steps performed by a non-key frame encoder.

Having described the encoding of the key frames 1011, the encoding of non-key frames 1012 performed in the non-key frame encoder 1022 is described next with reference to FIG. 1B where a schematic flow diagram of the steps performed by the encoder 1022 are shown. Non-key frames are supplied as input for a transformation in step 30. In the preferred embodiment this transformation is a DCT. Within step 30 the input non-key frame 1012 is typically transformed as it is done in JPEG, namely the non-key frame 1012 is tiled in a plurality of blocks, each block comprising 8×8 pixels. Again, if necessary, extra columns of image pixel data are appended to the image by replicating a column of the image so that the image width is a multiple of eight. Similarly, a row of the image is replicated to extend the image, if necessary. Each 8×8 block of pixels is then discrete cosine transformed into an 8×8 block of DCT coefficients.

As an alternative embodiment, the transformation in step 30 may be a wavelet transformation. In this alternative embodiment, the non-key frame 1012 does not have to be tiled into 8×8 blocks. The entire frame can be wavelet transformed and then tiled into 8×8 blocks. Again, if necessary, extra columns of image pixel coefficients can be appended to the transformed image so that the transformed image dimensions are multiples of eight.

Next, in step 40, each single 8×8 coefficient block is quantized. In the preferred embodiment quantization involves dividing each of the 8×8 DCT coefficients with a corresponding coefficient in an 8×8 quantization matrix, and rounding the result to the nearest integer. In the preferred embodiment, the value of a quantization step size parameter q is defined as:

$$q = 2 \times \log_2(1+\text{tol}) \quad (1)$$

where the constant tol is some tolerance, preferably 1% (0.01). Each 8×8 block of coefficients may have a different quantization step size parameter q. An advantage of using such a quantization step size parameter q is that the noise introduced by the quantization step 40 in some way matches the gain noise. The relative magnitude (gain noise/pixel magnitude) of gain noise is 1%. For quantization to match (in some way) the gain noise, it is desirable for a pixel x and its dequantized value x' to satisfy the constraint:

$$\frac{1}{1+g} \le \frac{x'}{x} \le 1+g \quad (2)$$

where g is the level of gain noise (e.g. g=0.01 for 1% gain noise). Now suppose the quantization is done uniformly in the log domain ($y = \log_2(x)$) with a step size of $q = 2 \times \log_2(1+\text{tol})$, then the quantization error is bound as follows:

$$-\frac{q}{2} = -\log_2(1+\text{tol}) < y - y' \le \frac{q}{2} = \log_2(1+\text{tol}) \quad (3)$$

since the quantization error is at most ½ the quantization step size. Transforming back to the original pixel (x) domain, the error bound is then:

$$2^{-\log_2(1+\text{tol})} < 2^{y-y'} \le 2^{\log_2(1+\text{tol})} \Rightarrow \frac{1}{1+\text{tol}} < \frac{x}{x'} < 1+\text{tol} \quad (4)$$

Thus, the quantization noise matches, or satisfies the bound of, the gain noise. For example if the constant tol=1%, then the error introduced by the quantization is at a similar level to that of gain noise of 1%. By using such quantization a high quality can be maintained while compressing. The quantization matches a gain noise of 1% (in a loose sense), while taking advantage of some basic frequency properties of the human visual system.

In other embodiments, other quantization step sizes can be used for quantizing the DCT coefficients in the luminance and chrominance channels. In particular the user may select a higher compression factor, trading off space for quality, which can be implemented by using larger quantization step sizes. Alternatively, the user may select a lower compression factor when quality is at a premium.

The quantization of step 40 is followed by bit plane extraction in step 50 where each block of coefficients is turned into a bit stream.

Figure 4:
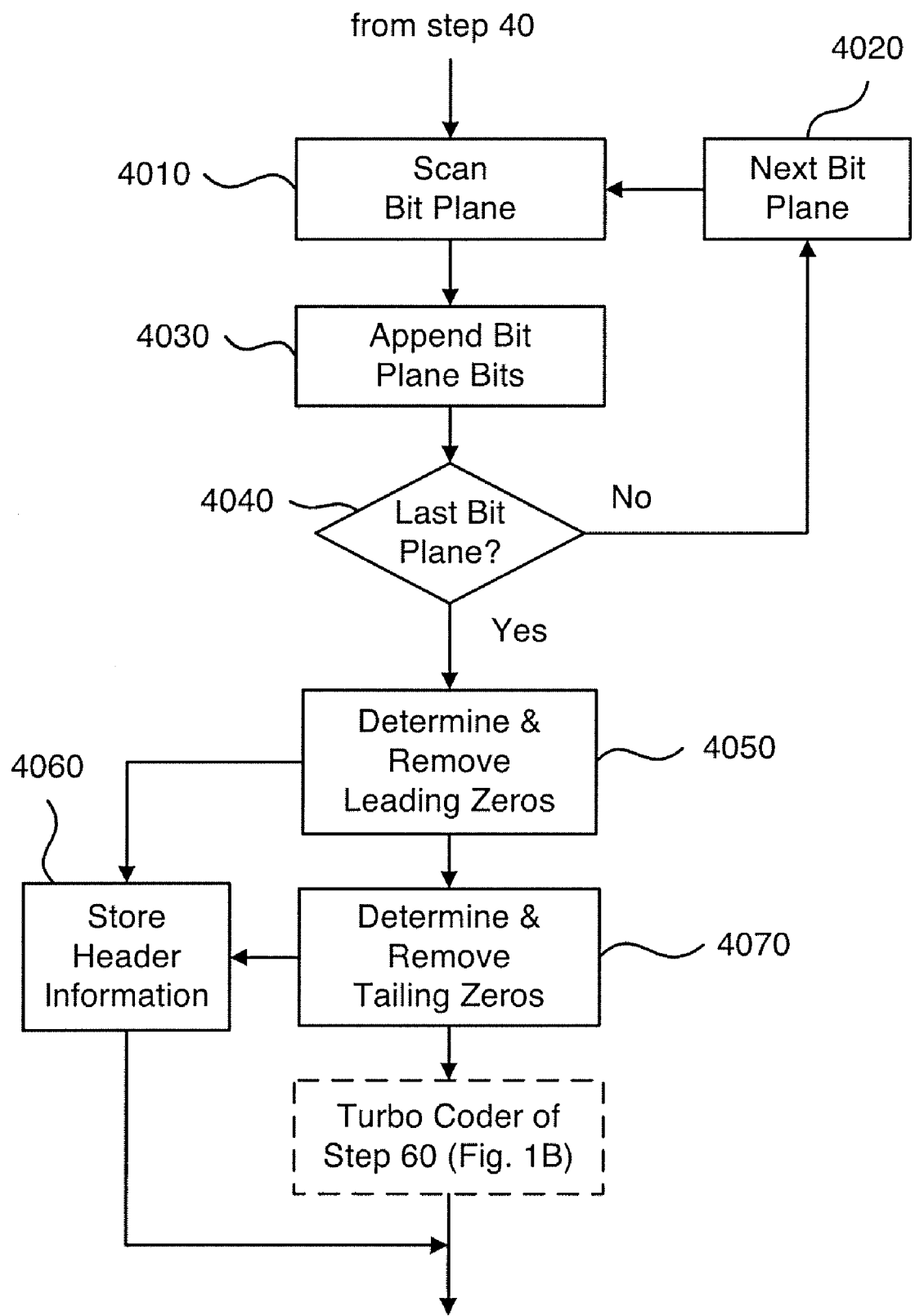
FIG. 4 shows a schematic flow diagram of turning a block of coefficients into a bit stream.

Step 50 is depicted in FIG. 4 in greater detail. Within each single quantized 8×8 block of coefficients, the coefficients are scanned in a zig-zag order in step 4010 in a manner similar to that in JPEG. Alternative scanning paths are possible, such as raster scan or the scanning path as it is employed in the JPEG2000 standard.

In the preferred embodiment the scanning in step 4010 starts on the most significant bit plane and concatenates on the most significant bits of the coefficients of the block. This forms a bit stream containing the most significant bits. In a second pass the scanning concatenates the second most significant bits of all coefficients of the block, selected in step 4020. The bits from the second scanning path are appended, in step 4030, to the bit stream generated in the previous scanning path.

The scanning and appending continues in this manner until step 4040 determines that the least significant bit plane is completed. This generates one bit stream for each single block.

Within this bit stream the number of leading zeros (i.e. the number of non significant coefficients before the first significant coefficient appears in the bit stream) is determined in step 4050, and the leading zeros of the coefficient block bit stream are removed from the bit stream. The number of leading zeros is stored in step 4060.

The leading and trailing zeros are interleaved, used to generate parity bits and then punctured. By reducing the amount of data that passes through these steps the efficiency of the system can be increased.

In the remaining bit stream the number of the tailing zeros is determined in step 4070, and the tailing zeros are removed from the bit stream. The tailing zeros are the zeros from the end of the remaining bit stream which are non significant. The number of tailing zeros is stored in step 4060. The remaining bit stream consists of the bits between the leading and the tailing zeros.

It is also possible to remove only the leading zeros, or alternatively only the trailing zeros, from the bitstream.

This remaining bit stream is sent to a turbo coder for encoding in step 60 to form an encoded bit stream of each block. Step 60 is described in detail below. The number of leading zeros and the number of tailing zeros is written into header information to the (turbo) encoded bit stream 1032 of each block. It is also possible to write the number of leading and/or trailing zeros into the bit stream and have the puncturer bypass this information.

A turbo coder performs better if the input bit stream is longer. As removing leading and trailing zeros alters the length of the input bit stream the performance of the turbo coder may be affected. In an alternative embodiment, to overcome the reduction in the bit stream length from trimming trailing and leading zeros, the scanning described above can extend over two or more blocks of coefficients. This lengthens the bit stream and improves the performance of the turbo coder. Depending on how the blocks are encoded into the bitstream this may also lengthen the run of the leading and the tailing zeros. If the blocks are simply concatenated together then no advantage will be gained. However, if the values of the blocks are interleaved then the leading and trailing zeros will also lengthen for the enlarged block. Alternatively each bitplane of the extended blocks could be encoded into the bitstream before moving on to the less significant bit planes.

Figure 2:
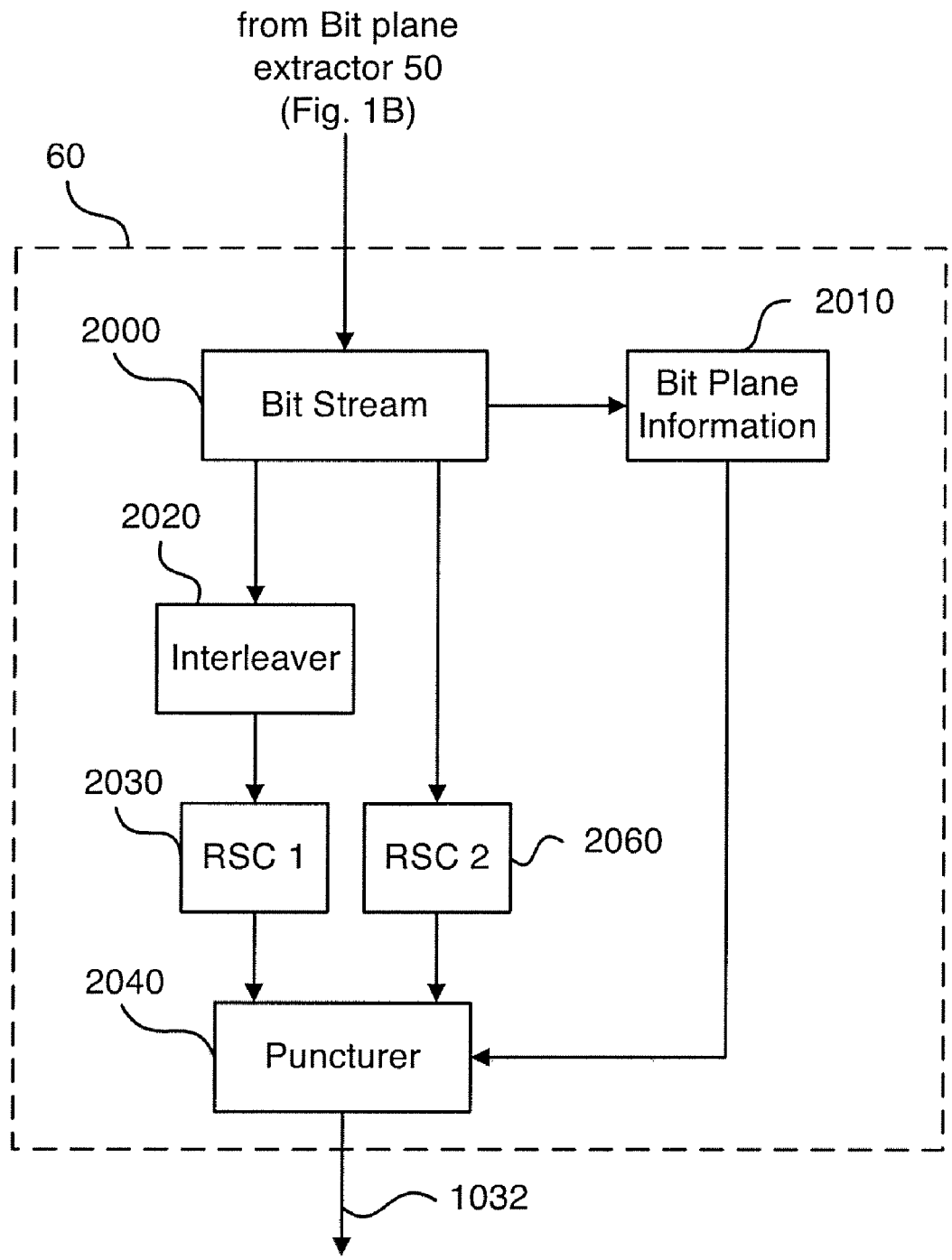
FIG. 2 shows a schematic block diagram of a turbo coder.

The turbo coder used in step 60 is now described in greater detail with reference to FIG. 2 where a schematic block diagram of the turbo coder is shown.

The turbo coder receives as input the bit stream 2000 from the bit plane extractor and which consists of the bits from the coefficient block. An interleaver 2020 interleaves the bit stream 2000 (the information bit stream, also called the systematic bits). In the preferred embodiment this interleaver 2020 is an algebraic interleaver. However, in alternative embodiments any other interleaver known in the art, for example a block interleaver, a random or pseudo-random interleaver, or a circular-shift interleaver, may be used.

The output from the interleaver 2020 is an interleaved bit stream, which is passed on to a recursive systematic coder 2030 which produces parity bits. One parity bit per input bit is produced. In the preferred embodiment the recursive systematic coder 2030 is generated using the octal generator polynomials 23 and 35.

A second recursive systematic coder 2060 operates directly on the bit stream 2000 from the bit plane extractor. In the preferred embodiment the recursive systematic coders 2030 and 2060 are identical. Both recursive systematic coders 2030 and 2060 output a parity bit stream to a puncturer 2040. Each parity bit stream is equal in length to the input bit stream 2000.

The puncturer 2040 deletes deterministically parity bits to reduce the parity bit overhead previously generated by the recursive systematic coders 2030 and 2060. Typically, so called half-rate codes are employed which means that half the parity bits from each recursive systematic encoder 2030 and 2060 are punctured.

In the prior art a puncturer typically deletes every second bit regardless of the bit plane. The puncturer 2040 uses the bit plane information, indication from which bit plane each bit originates and associated with the bit in the bit stream 2000, into a deterministic deletion process. Bits from less significant bit planes are less important and fewer parity bits are provided whereas bits from more significant bit planes are more important and more parity bits are provided.

In the preferred embodiment, assuming that there are 8 bit planes, no parity bits are punctured in the first (most significant) bit plane. In the second bit plane, every fourth parity bit is preferably punctured. In the third bit plane, every third parity bit is preferably punctured. In the fourth and fifth bit planes, every second bit is preferably punctured. In the sixth bit plane every third bit is preferably not punctured. In the seventh bit plane every fourth bit is preferably not punctured. In the eighth (least significant) bit plane all parity bits are punctured. This bit plane dependent puncturing scheme produces a half rate code. However, any other code rate can be achieved with a similar coding scheme.

In an alternative embodiment the bit plane depending puncturing scheme performed in the puncturer 2040 depends on the degree of quantization applied to a block of coefficients. No parity bits are provided on bit planes where quantization introduced large quantization errors.

The turbo coder 50 produce as output the punctured parity bit streams, which comprises parity bits produced by recursive systematic coders 2060 and 2030.

The encoding of both the key frames 1011 and the non-key frames 1012 is now fully described. In the following the joint decoding of both the encoded key 1031 and non-key frames 1032 performed in the joint decoder 1100 is described in detail with reference to FIG. 1C where a schematic block diagram of the joint decoder 1100 is shown.

The encoded key-frames 1031 are retrieved and are decoded using conventional JPEG (intra) decoding, which results in decoded key frames 1120.

The decoded key frames 1120 are also supplied to an estimator 1150 where the preceding five (decoded key or non-key) frames are used to obtain an estimate for the next frame to decode. Techniques to obtain this estimate may be any low complexity motion estimation, any full motion estimation, any multi-frame motion estimation, and sub-motion estimation as they are described in the literature in the art. Alternative methods can be from the vast field of interpolations and from the vast field of extrapolations or any combination of motion estimation, interpolation and extrapolation.

The estimated frame from the estimator 1150 is supplied to a discrete cosine transformer 1160 where a transformation of the estimated frame is produced. This results in a frame of predicted DCT coefficients in the preferred embodiment.

The encoded bit stream 1032 from a non-key frame is decoded by the decoder 1080. This is the inverse operation of the encoding performed by encoder 60 (FIG. 1 B). The encoded bit stream 1032 consists of header information about the leading and tailing zeros, as well as the bit stream information 2010 (as described above with reference to FIG. 2). It is noted that the output of the decoder 1080 is coefficients in the transformation domain. After all blocks of the non-key frame are decoded, the complete non-key frame is available in the transform domain.

Furthermore, the decoder 1080 also obtains input from the discrete cosine transformer 1160, with that additional information being used to improve the decoding quality. The decoder 1080 is described in more detail below.

Reconstructor 1090 receives two inputs. The first input is the decoded bit stream from the decoder 1080 representing DCT coefficients. This is a first set of DCT coefficients representing the current video frame. The second input to the reconstructor 1090 is the side information DCT coefficients produced by the discrete cosine transformer 1160, which is a second set of DCT coefficients representing the current video frame for a second time. In the reconstructor 1090 these two sets of DCT coefficients are compared. In the preferred embodiment a DCT coefficient from the first set of DCT coefficients is compared to the DCT coefficient from the same pixel location of the second set of DCT coefficients. If this difference is sufficiently small then the resulting DCT coefficient for this pixel location is set to be equal to the DCT coefficient from the second set of DCT coefficients in the preferred embodiment. If this difference is not sufficiently small then the resulting DCT coefficient equals the DCT coefficient from the first set of DCT coefficients.

In an alternative embodiment the DCT coefficients from the first and second sets are combined by a convex combination as follows:

$$\text{coeff}_{res} = \alpha \cdot \text{coeff}_{set1} \cdot (1-\alpha) \cdot \text{coeff}_{set2}, \quad (5)$$

where $\text{coeff}_{res}$ denotes the resulting DCT coefficient, and $\text{coeff}_{set1}$ and $\text{coeff}_{set2}$ denote the DCT coefficients from the first and second sets of DCT coefficients. Parameter $\alpha$ depends on the difference between the DCT coefficients $\text{coeff}_{set1}$ and $\text{coeff}_{set2}$.

The resulting DCT coefficients $\text{coeff}_{res}$ from the reconstructor 1090 are supplied to an inverse transformer 1091 where inverse transformation is carried out. This is the inverse of the transformation performed in transformer 30 (FIG. 1B). The output of the inverse transformer 1091 is completely decoded non-key frames.

The decoded non-key frames 1110 and the decoded key frames 1120 are supplied to merger 1180 (FIG. 1A) where the frames 1110 and 1120 are merged to form finally the complete decompressed video output 1200.

Having described the joint decoder 1100, the decoder 1080 within the joint decoder 1100 is now described in further detail with reference to FIG. 3 where a schematic block diagram of the decoder 1080 is shown. The decoder 1080 firstly splits the received encoded bit stream 1032 into parity bits 3000 and systematic bits 3010. The parity bits 3000 are split into two sets of parity bits: one set for the parity bits originating from the recursive systematic coder 2030 (FIG. 2) and one set of parity bits originating from the recursive systematic coder 2060 (FIG. 2).

Parity Bits 3020 are then input to a Component Decoder 3060, which preferably employs the Max-Log Maximum Aposteriori Probability (MAP) algorithm known in the art. In alternative embodiments the MAP, the Soft Output Viterbi Decoder (SOVA) or variations thereof are used instead of the Max-Log MAP algorithm.

The systematic bits 3010 are passed as input to an interleaver 3050. This interleaver 3050 is also linked to the component decoder 3060.

In a similar manner, Parity Bits 3040 are input to a Component Decoder 3070, together with the systematic bits 3010.

Figure 3:
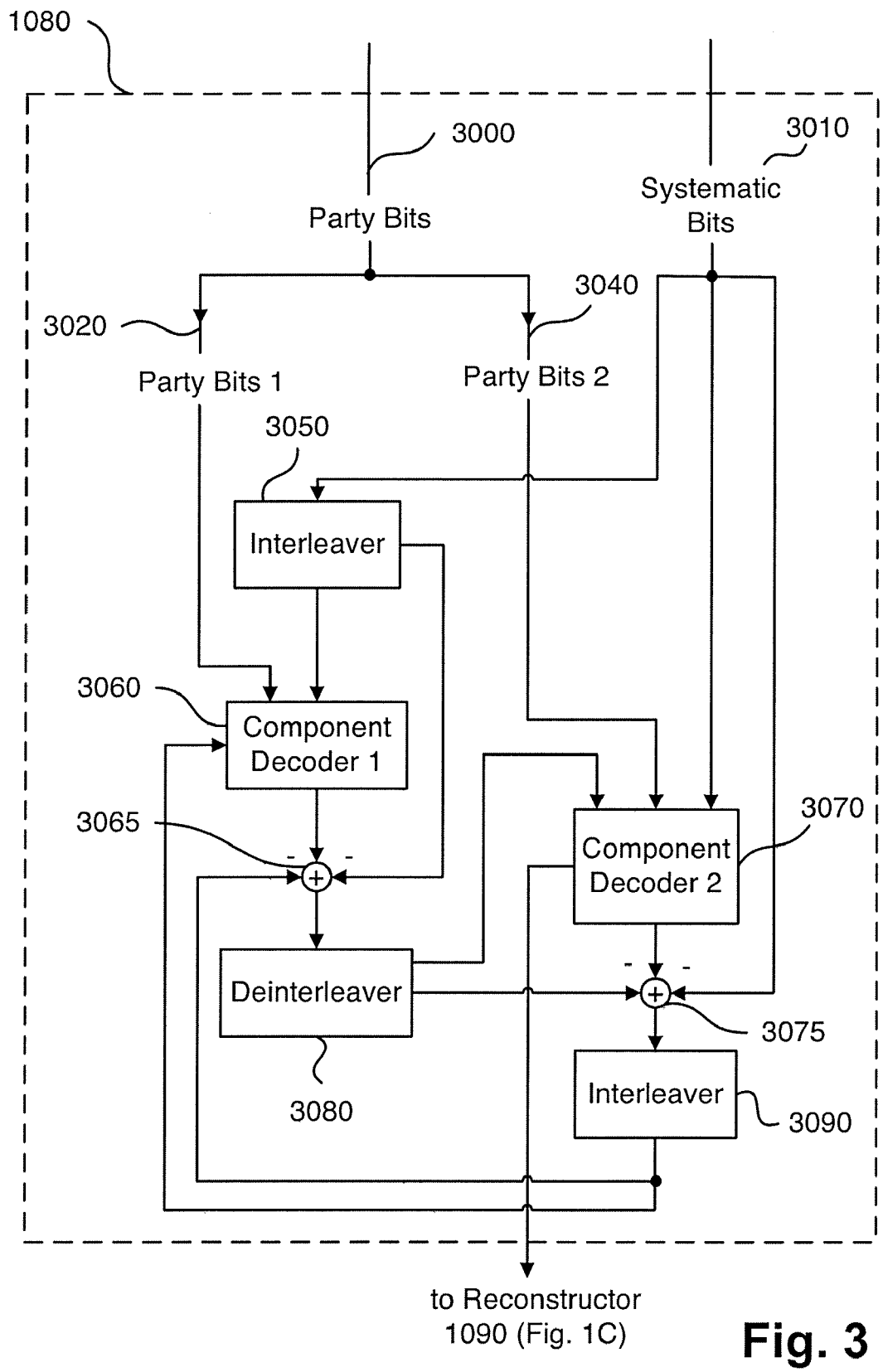
FIG. 3 shows a schematic block diagram of a decoder in which bit plane information is used.

As can be seen in FIG. 3, the decoder 1080 works iteratively. A loop is formed starting from component decoder 3060, to an adder 3065, to a deinterleaver 3080, to a component decoder 3070, to adder 3075, to interleaver 3090 and back to component decoder 3060.

The processing performed in this loop is now described in more detail. The component decoder 3060 takes three inputs; the parity bits 3020, the interleaved systematic bits from the interleaver 3050 and some output from the second component decoder 3070, which was modified in adder 3075 and interleaved in the interleaver 3090. The input from the one component decoder to the other component decoder provides information about the likely values of the bits to be decoded. This information is typically provided in terms of the Log Likelihood $$\text{Ratios } L(u_k) = \ln\left(\frac{P(u_k = +1)}{P(u_k = -1)}\right),$$

where $P(u_k+1)$ denotes the probability that the bit $u_k$ equals $+1$ and where $P(u_k-1)$ denotes the probability that the bit $u_k$ equals $-1$.

In the first iteration the feedback input from the second component decoder 3070 does not exist, whereas in the first iteration this input is set to zero.

The (decoded) bit sequence produced by component decoder 3060 is passed on to adder 3065 where the so called a priori information related to the bit stream is produced: the received systematic bits 3050 are extracted in adder 3065 and the information produced by the second component decoder 3070 (which are processed analogously in adder 3075 and interleaved in interleaver 3090) are extracted as well. Left over is the a priori information which gives the likely value of a bit. This information is valuable for the next decoder.

After adder 3065 the resulting bit stream is de-interleaved in deinterleaver 3080, which performs the inverse action of interleaver 3050. The de-interleaved bit stream from deinterleaver 3080 is obtained as input from component decoder 3070. In the preferred embodiment the component decoder 3070 as well as adder 3075 works analogously to component decoder 3060 and adder 3065 already described. The resulting bit stream is again interleaved in interleaver 3090 and used as input for the second iteration to the first component decoder 3060.

Figure 1C:
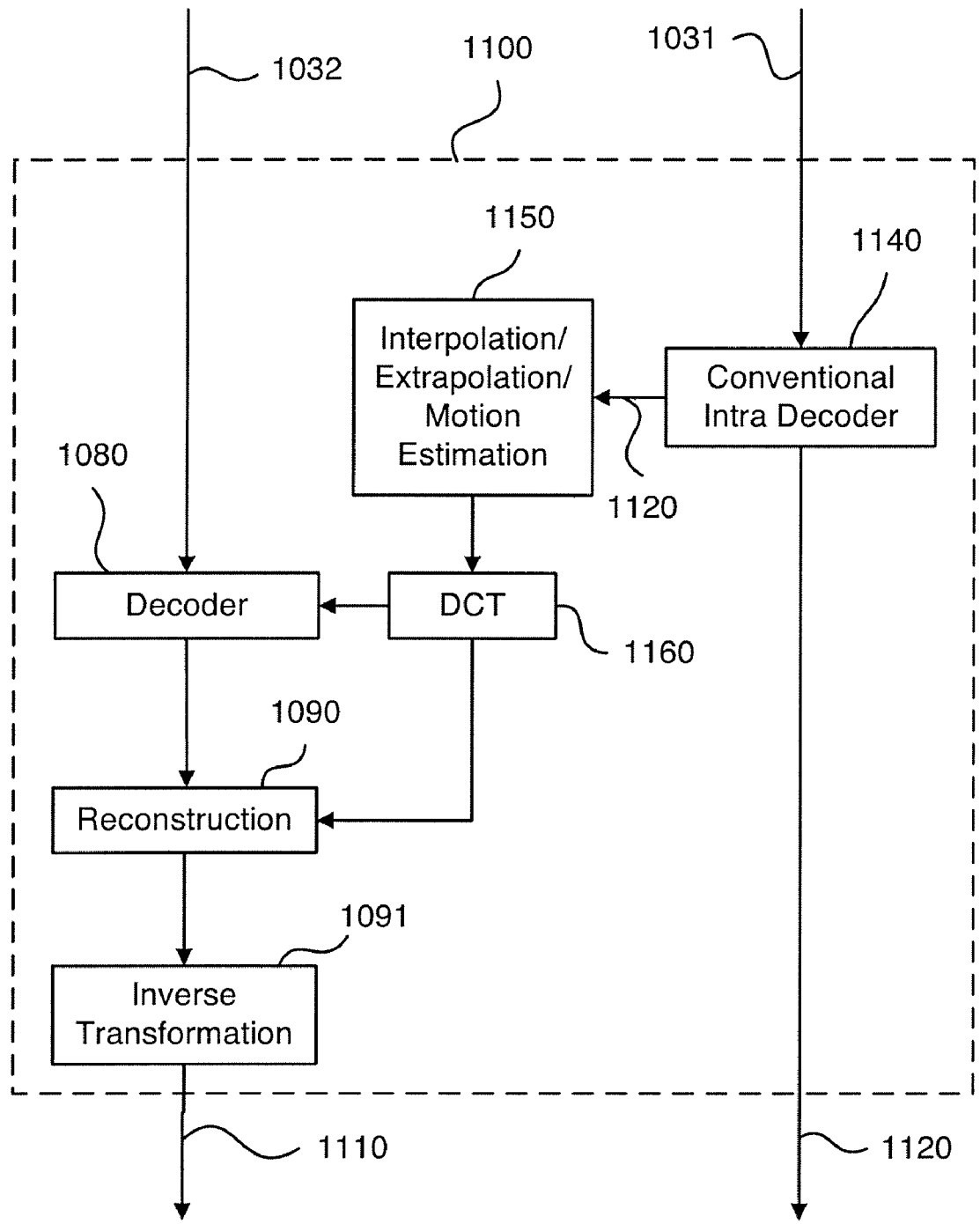
FIG. 1C shows a schematic block diagram of a joint decoder.

In the preferred embodiment eight iterations between the first component decoder 3060 and the second component decoder 3070 are carried out. After completion of eight iterations the resulting bit stream produced from component decoder 3070 is output to the reconstructor 1090 (FIG. 1C). This completes the description of the joint decoding of both key and non-key frames.

The foregoing describes only some embodiments of the present invention, and modifications and/or changes can be made thereto without departing from the scope and spirit of the invention, the embodiments being illustrative and not restrictive.

In the context of this specification, the word "comprising" means "including principally but not necessarily solely" or "having" or "including", and not "consisting only of". Variations of the word "comprising", such as "comprise" and "comprises" have correspondingly varied meanings.

I claim:

1. A method of encoding an input bitstream derived from a block of coefficients relating to video data, the method comprising the steps of:

determining and removing from said input bitstream a plurality of leading zeros or tailing zeros;

generating parity bits for bits remaining in said input bitstream; and creating an encoded bitstream comprising a number of leading zeros or tailing zeros and said parity bits.

2. The method according to claim 1 wherein said determining and removing step determines and removes a plurality of leading zeros and a plurality of tailing zeros, and said encoded bitstream comprises the number of leading zeros and the number of tailing zeros.

3. The method according to claim 1 wherein said input bitstream is formed by arranging bits from said video data in bitplane order.

4. Encoder for encoding an input bitstream derived from a block of coefficients relating to video data, the encoder comprising:

device for determining and removing from said input bitstream a plurality of leading zeros or tailing zeros;

device for generating parity bits for bits remaining in said input bitstream; and device for creating an encoded bitstream comprising a number of leading zeros or tailing zeros and said parity bits.

5. The encoder according to claim 4 wherein said device for determining and removing determines and removes a plurality of leading zeros and a plurality of tailing zeros, and said encoded bitstream comprises the number of leading zeros and the number of tailing zeros.

6. The encoder according to claim 4 or 5 wherein said input bitstream is formed through device for arranging bits from said video data in bitplane order.

7. A computer program product including a computer readable medium having recorded thereon a computer program for implementing a method of encoding an input bitstream derived from a block of coefficients relating to video data, the method comprising the steps of:

determining and removing from said input bitstream a plurality of leading zeros or tailing zeros;

generating parity bits for bits remaining in said input bitstream; and creating an encoded bitstream comprising a number of leading zeros or tailing zeros and said parity bits.

8. The computer program product according to claim 7 wherein said determining and removing step determines and removes a plurality of leading zeros and a plurality of tailing zeros, and said encoded bitstream comprises the number of leading zeros and the number of tailing zeros.

9. The method according to claim 7 wherein said input bitstream is formed by arranging bits from said video data in bitplane order.

\* \* \* \* \*